(12) United States Patent
Fu

(10) Patent No.: US 9,155,218 B2
(45) Date of Patent: Oct. 6, 2015

(54) ELECTRONIC APPARATUS AND FRAME STRUCTURE THEREOF

(71) Applicant: Wistron Corporation, New Taipei (TW)

(72) Inventor: Zhao-Ping Fu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 115 days.

(21) Appl. No.: 14/187,848

(22) Filed: Feb. 24, 2014

(65) Prior Publication Data

US 2014/0307387 A1 Oct. 16, 2014

(30) Foreign Application Priority Data

Apr. 11, 2013 (CN) .......................... 2013 1 0125640

(51) Int. Cl.
*G06F 1/16* (2006.01)
*H05K 7/14* (2006.01)

(52) U.S. Cl.
CPC ............ *H05K 7/1488* (2013.01); *H05K 7/1489* (2013.01)

(58) Field of Classification Search
USPC .......... 29/623.1, 731; 451/344, 359; 439/527, 439/325, 223, 630, 159, 733.1, 625, 676, 439/695; 361/679.17, 679.58, 679.21, 361/679.33, 679.59, 679.38, 679.39, 361/679.01, 679.02, 679.34, 679.32, 361/679.43, 679.48, 679.6, 679.27, 679.03; 312/415, 325, 408, 120, 123, 223, 312/319.1, 329; 345/173, 177, 175, 179; 349/12, 58, 61, 709

See application file for complete search history.

(56) References Cited

U.S. PATENT DOCUMENTS

| 5,555,227 | A  | * | 9/1996 | Kurosu ...................... 369/30.96 |
| 8,139,979 | B2 | * | 3/2012 | Koishi et al. .................. 399/111 |
| 8,152,294 | B2 | * | 4/2012 | Katsuyama et al. .......... 347/104 |

* cited by examiner

*Primary Examiner* — Hung Duong
(74) *Attorney, Agent, or Firm* — Muncy, Geissler, Olds & Lowe P.C.

(57) ABSTRACT

A frame structure of an electronic apparatus for containing a plurality of power supply units is disclosed. The frame structure includes a main frame, a tray, and at least one elastic element. The tray includes at least one fixing portion and is connected pivotally to the main frame to be in a first position or a second position. One end of each elastic element is fixed to the main frame, and the other end of each elastic element includes a fastening structure. When the tray is in the first position, each fixed portion is between the main frame and each elastic element. When the power supply units are placed into the main frame, each elastic element is pushed by the power supply units, and each fastening structure passes through the fixing portion and the main frame, for fixing the tray in the first position.

16 Claims, 6 Drawing Sheets

ELECTRONIC APPARATUS AND FRAME STRUCTURE THEREOF

BACKGROUND OF THE DISCLOSURE

1. Field of the Disclosure

The present disclosure relates to a frame structure of an electronic apparatus; more particularly, it relates to a frame structure of an electronic apparatus for containing a plurality of power supply units.

2. Description of the Related Art

For the large computing apparatus, such as the server, the data volume which needs to be stored and processed is larger, so that more electronic components needed to supply power are disposed in the large computing apparatus. Therefore, the large computing apparatus must have a plurality of power supply units to supply enough electricity for use requirements. Due to the space in the server is limited, the plurality of power supply units are stacked in the server to save the space. In this design, the power supply unit stacked on the upper position needs to use an additional converter board to converse the power. However, the converter board usually is extended over the locating range of the power supply unit, so that the assembly of the motherboard of the server may be interfered by the converter board. For example, during an assembly process of the server, the motherboard must be assembled first, and then the power supply units and the converter board can be assembled. If the motherboard gets problem of the assembly or using, the user must remove the whole power supply unit and the converter board, and he or she can continuously change or repair for the motherboard. It is more inconvenience for the assembly or repairing of the server.

Therefore, it is worthy to research to improve the locating of the power supply units, so that the assembly of the motherboard in the server is not interfered by the power supply units and the space of the server can be saved.

SUMMARY OF THE DISCLOSURE

It is an object of the present disclosure to provide a frame structure of an electronic apparatus for containing a plurality of power supply units.

To achieve the abovementioned object, the frame structure of the electronic apparatus of the present disclosure includes a main frame, a tray, and at least one elastic element. The main frame includes a clapboard for forming a plurality of recesses. The tray is pivotally connected to the main frame. The tray can rotate relative to the main frame to a first position which is substantially parallel to the clapboard, or a second position which is substantially perpendicular to the clapboard. The tray includes at least one fixing portion. Each elastic element includes a first end and a second end, and the first end is fixed to an inside of the main frame; a distance is between the second end and the main frame, and the second end includes a fastening structure. When the tray is located in the first position, each fixing portion is located between each second end and the main frame. During a process that the power supply unit is placed into the main frame, the second end of each elastic element is pushed via the power supply unit, so that each fastening structure passes through the fixing portion of the tray located in the first position and the main frame to fix the tray.

The electronic apparatus of the present disclosure includes a case, a plurality of power supply units, and the abovementioned frame structure. The frame structure is used for containing the plurality of power supply units and is combined with the case.

Accordingly, if the electronic components (such as the motherboard or the function modules) located near the frame structure in the electronic apparatus needs to be assembled or changed, the user only needs to rotate the tray of the frame structure from the first position to the second position and positions the tray, and other electronic components are not interfered by the tray, so that it is beneficial for the assembly or repairing for the electronic apparatus. When the tray returns to the first position, the tray can be fastened stably without any tool or member via placing directly the power supply unit into the main frame.

DETAILED DESCRIPTION OF THE PREFERRED EMBODIMENT

These and other objects and advantages of the present disclosure will become apparent from the following description of the accompanying drawings, which disclose several embodiments of the present disclosure. It is to be understood that the drawings are to be used for purposes of illustration only, and not as a definition of the disclosure.

Figure 1:
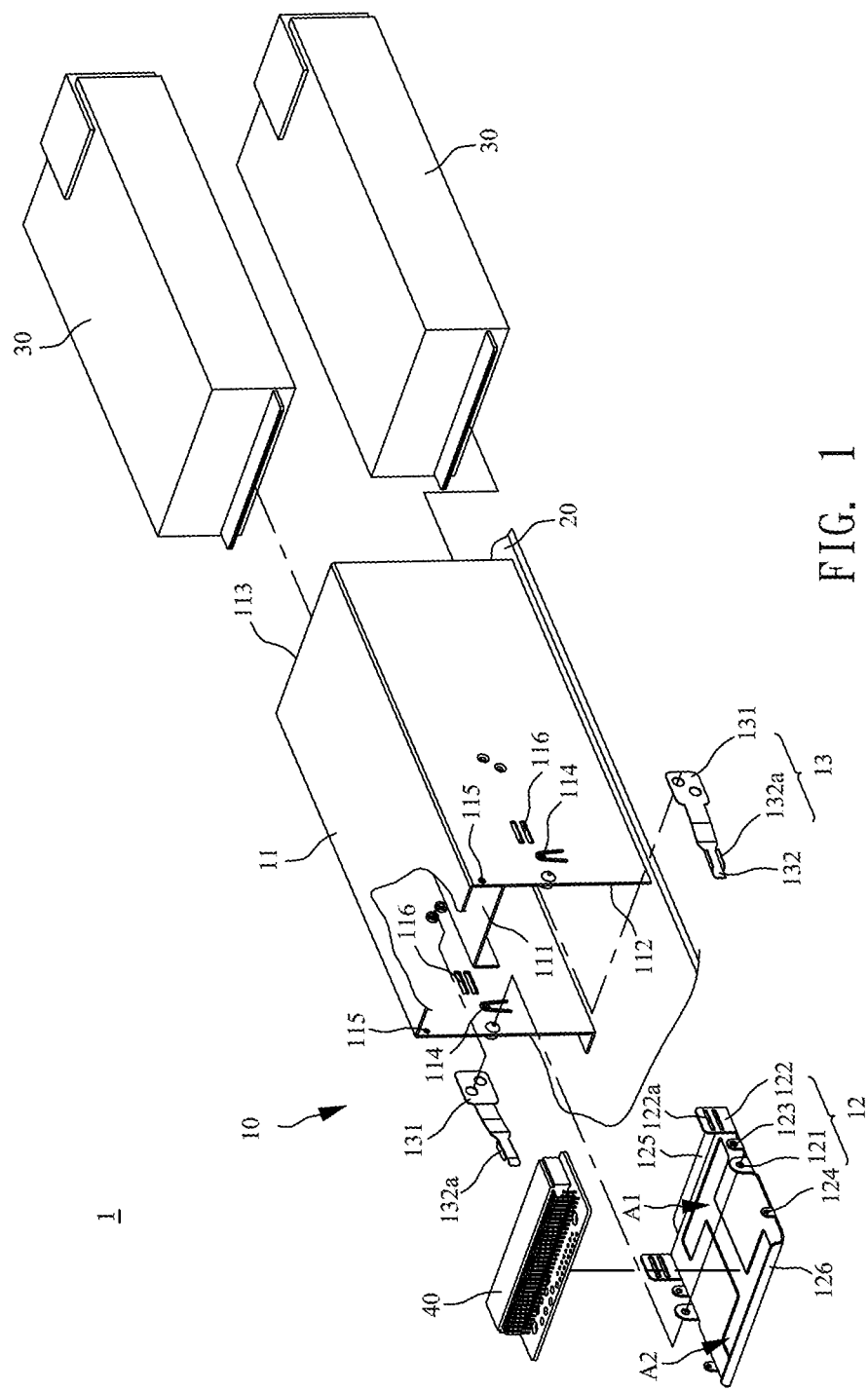
FIG. 1 illustrates an exploded perspective view of the frame structure of the electronic apparatus of the present disclosure.

Please refer to FIG. 1, which illustrates an exploded perspective view of the frame structure 10 of the electronic apparatus of the present disclosure. As shown in FIG. 1, in one embodiment of the present disclosure, the electronic apparatus 1 can be a large computing apparatus, such as a server, but the present disclosure is not limited to this. The electronic apparatus 1 can also be other apparatus with the similar structure. The electronic apparatus 1 of the present disclosure includes a case 20, a plurality of power supply units 30, and a frame structure 10. The frame structure 10 is combined with the case 20. The plurality of power supply units 30 can be placed into the frame structure 10, and electrically connected to the converter board 40 on the frame structure 10 and the motherboard (not shown in FIG. 1) located in the case 20. The plurality of power supply units 30 provide the necessary power to every electronic component in the electronic apparatus 1.

As shown in FIG. 1, the frame structure 10 of the electronic apparatus of the present disclosure comprises a main frame 11, a tray 12, and at least one elastic element 13. The main frame 11 comprises a clapboard 111, a first opening 112, and a second opening 113. The main frame 11 can be directly located on the case 20. A space between the main frame 11 and the case 20 can be divided via the clapboard 111 to form a plurality of recesses, and each recess can contain a power supply unit 30. In this embodiment, the main frame 11 is an inverted U-shaped structure, and the main frame 11 is divided to form two recesses via the single clapboard 111. The clapboard 111 is disposed substantially horizontally, but the present disclosure is not limited to this. The first opening 112 and the second opening 113 are two openings at two opposite sides of the main frame 11.

Besides, in the present embodiment, the main frame 11 further comprises at least one first corresponding positioning portion 114, at least one second corresponding positioning portion 115, and at least one corresponding hole 116. The at least one first corresponding positioning portion 114 is used for coordinating with the corresponding structure of the tray 12, allowing the tray 12 to be located in a first position P1 (not shown in FIG. 1, please refer to FIG. 3). The at least one first corresponding positioning portion 114 is located between the clapboard 111 of the main frame 11 and the first opening 112. The at least one second corresponding positioning portion 115 is used for coordinating with the corresponding structure of the tray 12, allowing the tray 12 to be located in a second position P2 (not shown in FIG. 1, please refer to FIG. 2). The at least one second corresponding positioning portion 115 is located on a peripheral portion of the first opening 112 of the main frame 11. The at least one corresponding hole 116 is used for coordinating with the corresponding structures of the at least one elastic element 13 and the tray 12, to provide the fastening function to the tray 12 in the first position P1 when the power supply unit is disposed; and the at least one corresponding hole 116 is located between the clapboard 111 of the main frame 11 and the first opening 112. In this embodiment, the at least one first corresponding positioning portion 114, the at least one second corresponding positioning portion 115, and the at least one corresponding hole 116 are designed to be a symmetrical structure group, which means there are two first corresponding positioning portion 114, two second corresponding positioning portion 115, and two the corresponding hole 116 for providing the stability of locating or fastening.

The tray 12 is used for fixing the converter board 40 which is electrically connected to the power supply unit 30 located on the upper recess. The tray 12 is pivotally connected to the first opening 112 of the main frame 11, so that the tray 12 can rotate relative to the main frame 11. The tray 12 comprises a set of pivot portion 121. A corresponding axis of the set of pivot portion 121 is on the central or near the central part of the tray 12, and divides the tray 12 to a first area A1 and a second area A2. The tray 12 is pivotally connected to the first opening 112 of the main frame 11 via the set of the pivot portion 121; when the tray 12 rotates to a first position P1, the first area A1 of the tray 12 is completely located in the main frame 11. The tray 12 further comprises at least one fixing portion 122. Each fixing portion 122 is located in the first area A1 for providing a fastening function of the tray 12 in the first position. In this embodiment, each fixing portion 122 comprises at least one hole 122a. Each hole 122a and each corresponding hole 116 have the similar structures. In this embodiment, the at least one fixing portion 122 is designed to be a symmetrical structure group, which means there are two fixing portion 122, and each fixing portion 122 comprises two holes 122a for providing the stability of fastening.

In this embodiment, the tray 12 further comprises at least one first positioning portion 123 and at least one second positioning portion 124. A structure of each first positioning portion 123 is corresponded to a structure of each first corresponding positioning portion 114 of the main frame 11, such as bumps and corresponding grooves, and the at least one first positioning portion 123 is located in the first area A1. A structure of each second positioning portion 124 is corresponded to a structure of each second corresponding positioning portion 115 of the main frame 11, such as the abovementioned bumps and corresponding grooves, and the at least one second positioning portion 124 is located in the second area A2. In this embodiment, the at least one first positioning portion 123 and the at least one second positioning portion 124 are designed respectively to be a symmetrical structure group, which means there are two first positioning portion 123 and two second positioning portion 124, for providing the stability of fastening.

Besides, the tray 12 further comprises a first extending portion 125 and a second extending portion 126. The first extending portion 125 in the first area A1 extends opposite to the pivot portion 121, to provide a blocking effect between the tray 12 and the clapboard 111; the second extending portion 126 in the second area A2 outwards the tray 12 along the plane of the tray 12, to provide another blocking effect between the tray 12 and the main frame 11.

Each elastic element 13 comprises a first end 131 and a second end 132, and each elastic element 13 is located on a path that the power supply unit 30 places into the main frame 11. The first end 131 of each elastic element 13 is fastened to an inside of the main frame 11, and a distance is between the second end 132 and the inside of the main frame 11. The second end 132 comprises a fastening structure 132a. The fastening structure 132a is at least one protruding member, such as a latch or a lug. The fastening structure 132a can correspondingly pass through the hole 122a of each fixing portion 122 of the tray 12 and the corresponding hole 116 of the main frame 11.

Figure 2:
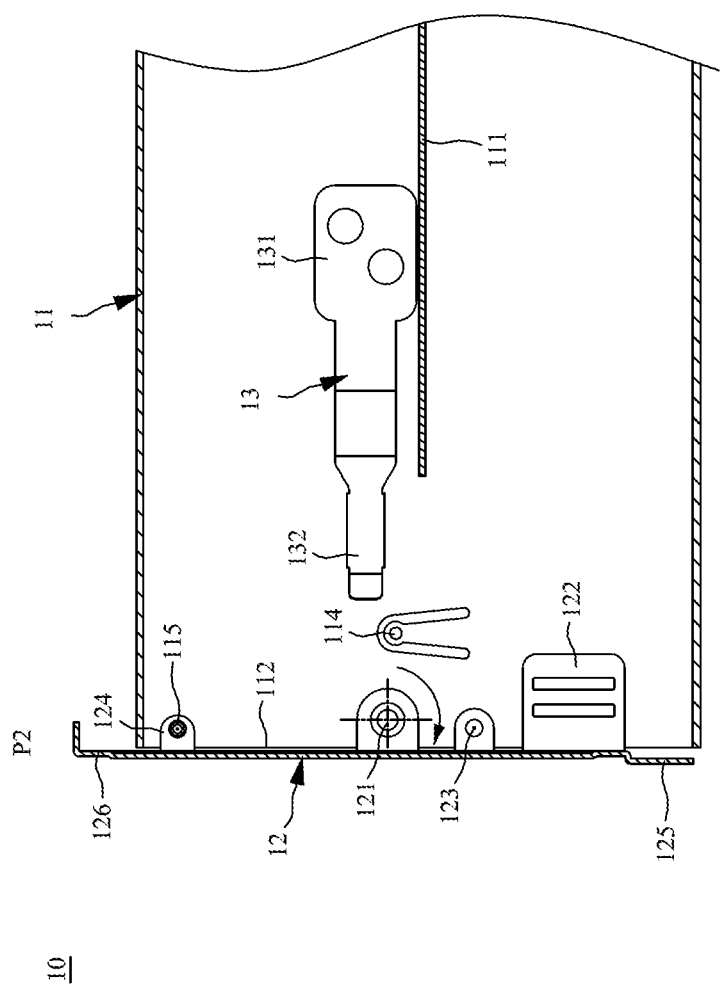
FIG. 2 illustrates a schematic drawing of the tray of the frame structure of the electronic apparatus in the second position of the present disclosure.
Figure 3:
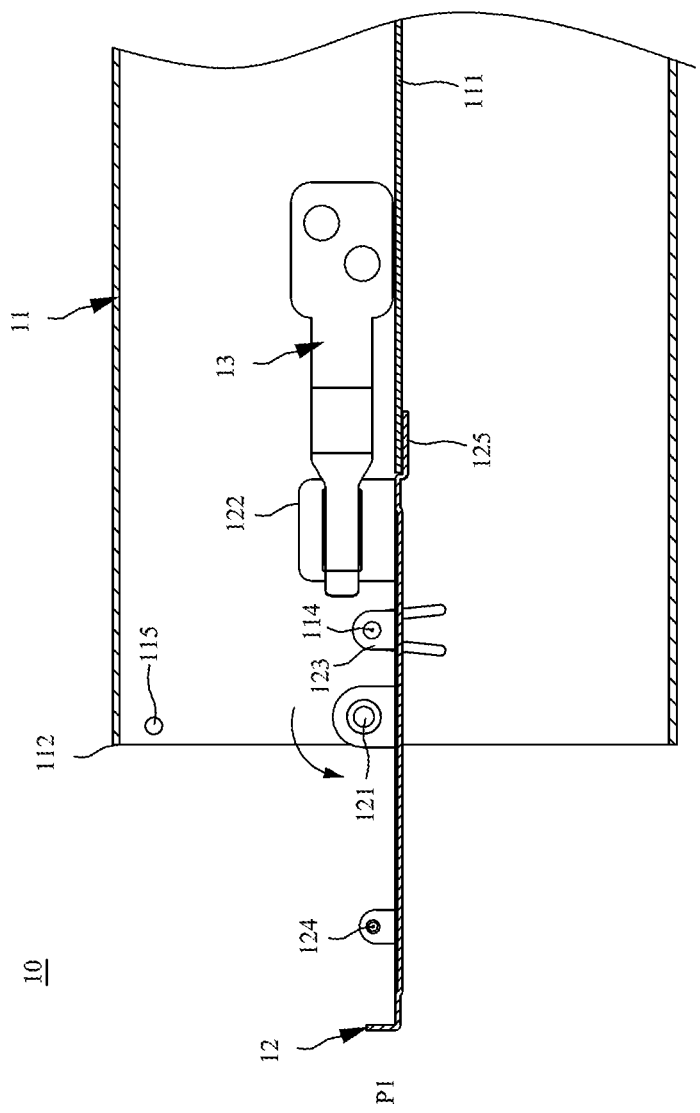
FIG. 3 illustrates a schematic drawing of the tray of the frame structure of the electronic apparatus in the first position of the present disclosure.
Figure 4:
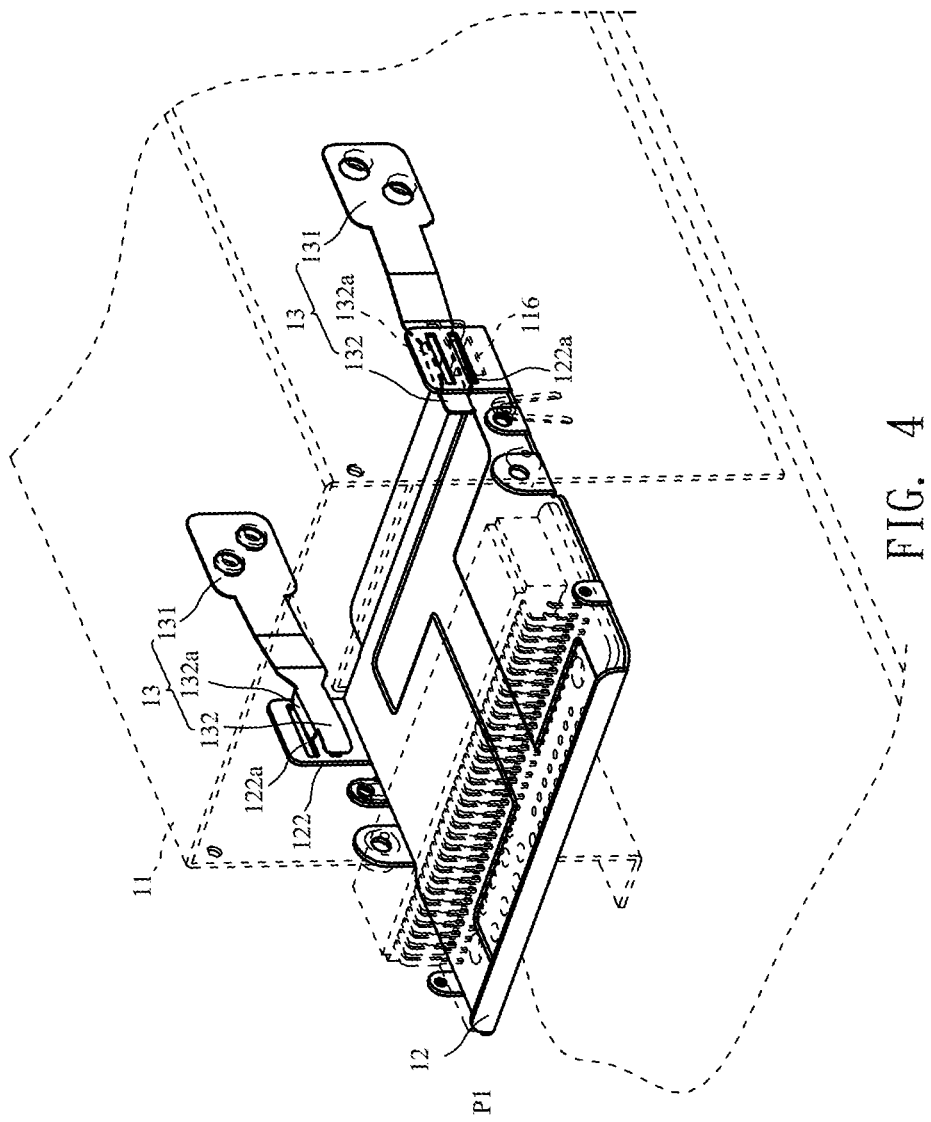
FIG. 4 illustrates a schematic drawing of the located frame structure of the electronic apparatus of the present disclosure.

Please refer to FIG. 2 to FIG. 4. FIG. 2 illustrates a schematic drawing of the tray 12 of the frame structure 10 of the electronic apparatus in the second position P2 of the present disclosure. FIG. 3 illustrates a schematic drawing of the tray 12 of the frame structure 10 of the electronic apparatus in the first position P1 of the present disclosure. FIG. 4 illustrates a schematic perspective drawing of the tray 12 of the frame structure 10 of the electronic apparatus of the present disclosure in the first position P1.

The tray 12 can rotate relative to the main frame 11 to the first position P1 which is substantially parallel to the clapboard 111 as shown in FIG. 3, or to the second position P2 which is substantially perpendicular to the clapboard 111 as shown in FIG. 2.

As shown in FIG. 2, when the tray 12 is forced to rotate clockwise relative to the main frame 11 along the arrow shown in FIG. 2, the tray 12 can rotate to the second position P2 that the tray 12 is substantially perpendicular to the clapboard 111 of the main frame 11. At this moment, the tray 12 is locked and positioned via the coordinating of each second positioning portion 124 and each second corresponding positioning portion 115 of the main frame 11, so that the tray 12 is kept in the second position P2. The second extending portion 126 of the tray 12 in the second position P2 is also blocked by the main frame 11, so that a rotatable angle of the tray 12 along the clockwise rotation direction in FIG. 2 is limited. At this moment, the tray 12 is against the first opening 112 of the main frame 11, and the tray 12 is unable to extend outwards the main frame along the substantially horizontal direction. Therefore, the tray 12 will not interfere the changing or assembly of the other electronic components near the frame structure 10.

As shown in FIG. 3 and FIG. 4, when the tray 12 is forced to rotate counterclockwise relative to the main frame 11 along the arrow shown in FIG. 3, the tray 12 can rotate to the first position P1 that the tray 12 is substantially parallel to the clapboard 111 of the main frame 11. At this moment, the tray 12 is positioned and locked via the coordinating of each first positioning portion 123 and each first corresponding positioning portion 114 of the main frame 11, so that the tray 12 is kept in the first position P1. The first extending portion 125 of the tray 12 in the first position P1 is also blocked by the clapboard 111 of the main frame 11, so that a rotatable angle of the tray 12 along the counterclockwise rotation direction in FIG. 3 is limited. It means that the rotatable angle of the tray 12 limited between the first position P1 to the second position P2 is about 90° in this embodiment.

When the tray 12 is in the first position P1, each fixing portion 122 of the tray 12 is located between each second end 132 of the elastic element 13 and the main frame 11, and a position of each fastening structure 132a of the second end 132 of the elastic element 13 is corresponded to a position of each hole 122a of the fixing portion 122 of the tray 12 and each corresponding hole 116 of the main frame 11.

Figure 5:
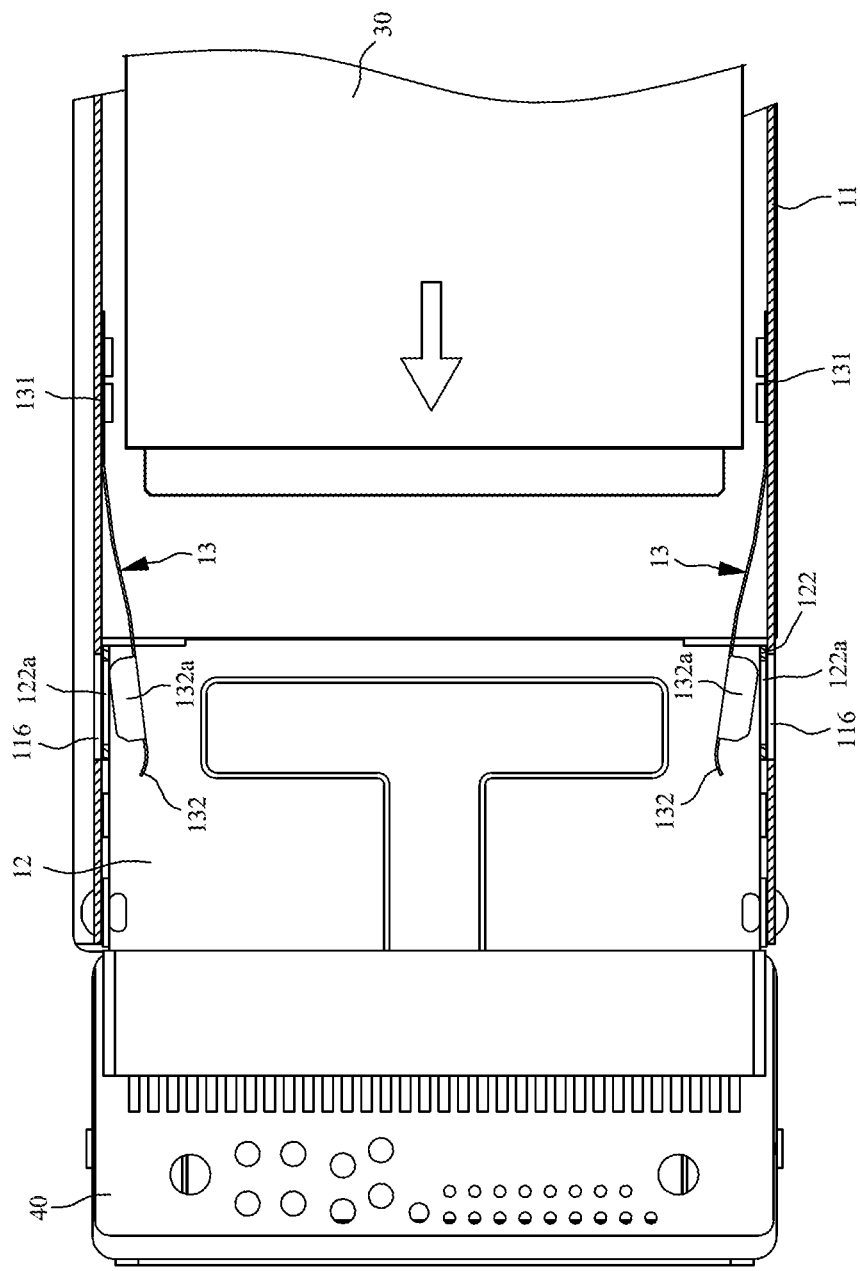
FIG. 5 illustrates a schematic drawing of the frame structure of the electronic apparatus of the present disclosure before the power supply unit pushes each elastic element.
Figure 6:
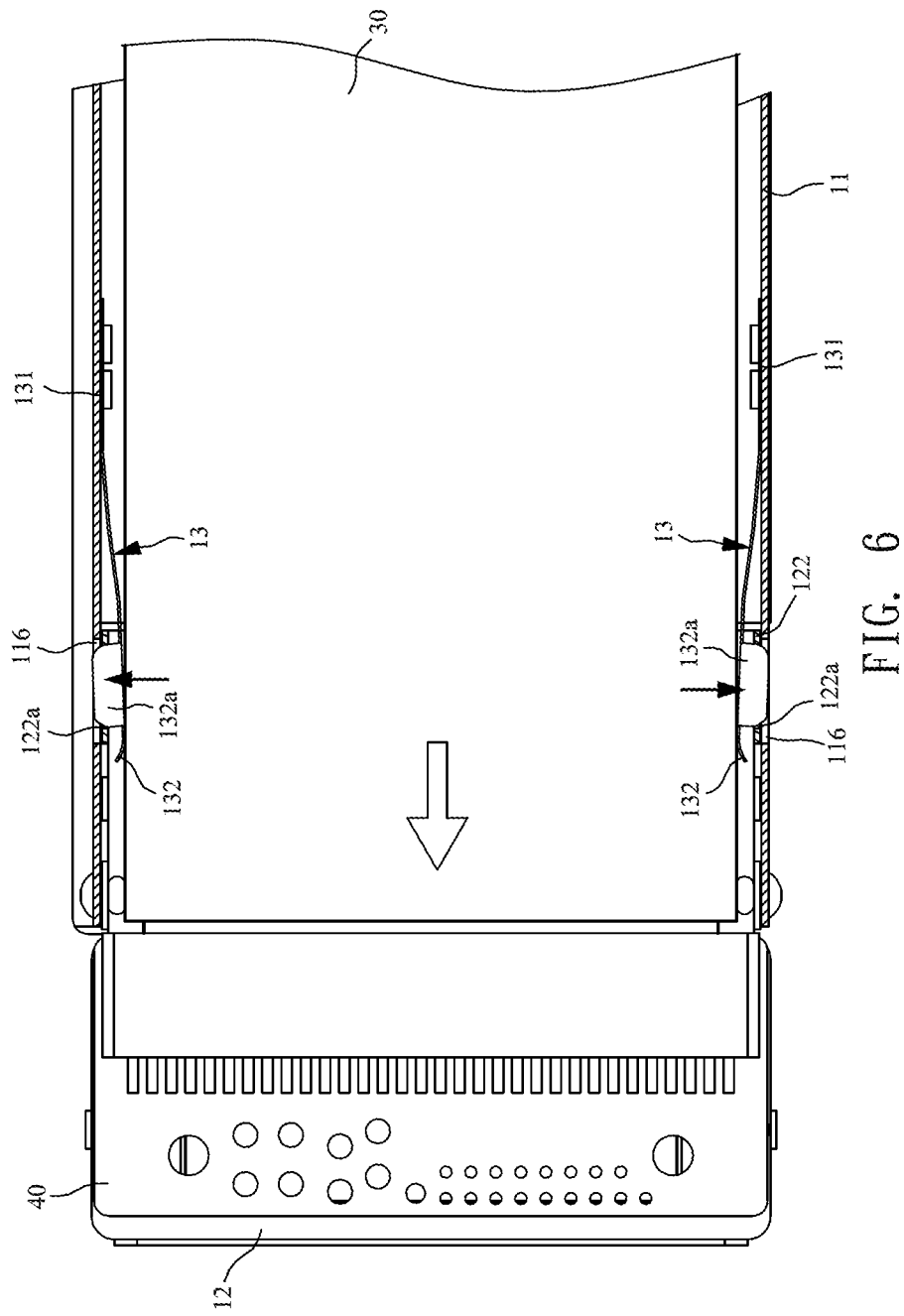
FIG. 6 illustrates a schematic drawing of the frame structure of the electronic apparatus of the present disclosure after the power supply unit pushes each elastic element.

Please refer to FIG. 5 and FIG. 6. FIG. 5 illustrates a schematic drawing of the frame structure 10 of the electronic apparatus of the present disclosure before the power supply unit 30 pushes each elastic element 13. FIG. 6 illustrates a schematic drawing of the frame structure 10 of the electronic apparatus of the present disclosure after the power supply unit 30 pushes each elastic element 13.

As shown in FIG. 1 and FIG. 5, during a process that the power supply unit 30 is placed into the main frame 11, the power supply unit 30 enters the recess corresponded to the main frame 11 from the second opening 113 of the main frame 11 shown in FIG. 1, and moves towards the first opening 112, until the power supply unit 30 is electrically connected to the converter board 40 located on the tray 12. At this moment, the tray 12 is kept in the abovementioned first position P1. When the second end 132 of each elastic element 13 is not pushed by any external force, a distance is kept between the second end 132 of each elastic element 13 and the main frame 11, and the fastening structure 132a of the second end 132 does not pass through the hole 122a of the fixing portion 122 of the tray 12 and the corresponding hole 116 of the main frame 11. Therefore, the tray 12 can still be forced to leave the first position P1.

As shown in FIG. 6, when the power supply unit 30 continuously moves towards the converter board 40 and pushes the second end 132 of each elastic element 13, the second end 132 of each elastic element 13 swings towards a moving direction which is substantially perpendicular to the power supply unit 30 via the external force; then each fastening structure 132a of the second end 132 correspondingly passes through each hole 122a of the fixing portion 122 of the tray 12 and each corresponding hole 116 of the main frame 11. Therefore, the tray 12 is fastened by each elastic element 13, so that the tray 12 is kept in the first position P1 stably, and the electric connection between the power supply unit 30 and the converter board 40 is not affected by the external force.

On the contrary, during a process that the power supply unit 30 leaves the main frame 11, the second end 132 of each elastic element 13 can return to the position shown in FIG. 5 via its own elastic force after the power supply unit 30 does not push the second end 132 of each elastic element 13. Each fastening structure 132a of the second end 132 leaves each corresponding hole 116 of the main frame 11 and each hole 122a of the fixing portion 122 of the tray 12, so that the tray 12 can rotate to the abovementioned second position P2 via the external force.

Accordingly, the assembly interference for the motherboard or other electronic components in the electronic apparatus caused by the frame structure can be reduced via the changing positions of the tray. The tray can be fastened according to whether the power supply unit is placed into the main frame. It is more convenience for the assembly or repairing of the electronic apparatus.

It is noted that the above-mentioned embodiments are only for illustration. It is intended that the present disclosure cover modifications and variations of this disclosure provided they fall within the scope of the following claims and their equivalents. Therefore, it will be apparent to those skilled in the art that various modifications and variations can be made to the structure of the present disclosure without departing from the scope or spirit of the disclosure.

What is claimed is:

1. A frame structure of an electronic apparatus, used for containing a plurality of power supply units, the frame structure of the electronic apparatus comprising:
   a main frame, comprising a clapboard, used for forming a plurality recesses;
   a tray, pivotally connected to the main frame, the tray being able to rotate relative to the main frame to a first position which is substantially parallel to the clapboard, or a second position which is substantially perpendicular to the clapboard;
   the tray comprising at least one fixing portion; and
   at least one elastic element, each elastic element comprising a first end and a second end; the first end being fixed to an inside of the main frame, a distance is between the second end and the main frame, and the second end comprising a fastening structure; wherein when the tray is located in the first position, each fixing portion is located between each second end and the main frame;
   wherein during a process that the power supply unit is placed into the main frame, the second end of each elastic element is pushed via the power supply unit, so that each fastening structure passes through the fixing portion of the tray located in the first position and the main frame to fix the tray.

2. The frame structure of the electronic apparatus as claimed in claim 1, wherein the tray further comprises at least one first positioning portion, and the main frame comprises at least one first corresponding positioning portion; the tray is positioned in the first position via the at least one first positioning portion coordinating with the at least one first corresponding positioning portion.

3. The frame structure of the electronic apparatus as claimed in claim 2, wherein the tray further comprises at least one second positioning portion, and the main frame comprises at least one second corresponding positioning portion; the tray is positioned in the second position via the at least one second positioning portion coordinating with the at least one second corresponding positioning portion.

4. The frame structure of the electronic apparatus as claimed in claim 1, wherein the fastening structure of the second end of each elastic element is at least one protruding member; each fixing portion of the tray comprises at least one hole, and the main frame comprises at least one corresponding hole; the at least one protruding member can correspondingly pass through the at least one hole and the at least one corresponding hole.

5. The frame structure of the electronic apparatus as claimed in claim 1, wherein the tray further comprises a first extending portion; when the tray is located in the first position, a rotatable angle of the tray along a first rotation direction is limited via the clapboard blocking the first extending portion.

6. The frame structure of the electronic apparatus as claimed in claim 5, wherein the tray further comprises a second extending portion; when the tray is located in the second position, a rotatable angle of the tray along a second rotation direction opposite to the first rotation direction is limited via the main frame blocking the second extending portion.

7. The frame structure of the electronic apparatus as claimed in claim 1, wherein the main frame further comprises a first opening and a second opening, the tray is pivotally connected to the first opening, and the power supply unit is placed into the main frame from the second opening.

8. The frame structure of the electronic apparatus as claimed in claim 1, wherein the second end of each elastic element which is pushed, swings towards a direction substantially perpendicular to a moving direction of the power supply unit.

9. An electronic apparatus, comprising:
a case;
a plurality of power supply units for supplying power;
a frame structure, being used for containing the plurality of power supply units, and being combined with the case, the frame structure comprising:
  a main frame, comprising a clapboard, used for forming a plurality of recesses;
  a tray, pivotally connected to the main frame, the tray being able to rotate relative to the main frame to a first position which is substantially parallel to the clapboard, or a second position which is substantially perpendicular to the clapboard; the tray comprising at least one fixing portion; and
at least one elastic element, each elastic element comprising a first end and a second end; the first end being fixed to an inside of the main frame, a distance is between the second end and the main frame, and the second end comprising a fastening structure; wherein when the tray is located in the first position, each fixing portion is located between each second end and the main frame;
wherein during a process that the power supply unit is placed into the main frame, the second end of each elastic element is pushed via the power supply unit, so that each fastening structure passes through the fixing portion of the tray located in the first position and the main frame to fix the tray.

10. The electronic apparatus as claimed in claim 9, wherein the tray further comprises at least one first positioning portion, and the main frame comprises at least one first corresponding positioning portion; the tray is positioned in the first position via the at least one first positioning portion coordinating with the at least one first corresponding positioning portion.

11. The electronic apparatus as claimed in claim 9, wherein the tray further comprises at least one second positioning portion, and the main frame comprises at least one second corresponding positioning portion; the tray is positioned in the second position via the at least one second positioning portion coordinating with the at least one second corresponding positioning portion.

12. The electronic apparatus as claimed in claim 9, wherein the fastening structure of the second end of each elastic element is at least one protruding member; each fixing portion of the tray comprises at least one hole, and the main frame comprises at least one corresponding hole, the at least one protruding member can correspondingly pass through the at least one hole and the at least one corresponding hole.

13. The electronic apparatus as claimed in claim 9, wherein the tray further comprises a first extending portion; when the tray is located in the first position, a rotatable angle of the tray along a first rotation direction is limited via the clapboard blocking the first extending portion.

14. The electronic apparatus as claimed in claim 13, wherein the tray further comprises a second extending portion; when the tray is located in the second position, a rotatable angle of the tray along a second rotation direction opposite to the first rotation direction is limited via the main frame blocking the second extending portion.

15. The electronic apparatus as claimed in claim 9, wherein the main frame further comprises a first opening and a second opening, the tray is pivotally connected to the first opening, and the power supply unit is placed into the main frame from the second opening.

16. The electronic apparatus as claimed in claim 9, wherein the second end of each elastic element which is pushed, swings towards a direction substantially perpendicular to a moving direction of the power supply unit.

* * * * *